United States Patent [19]

Kinoshita et al.

[11] 4,263,571
[45] Apr. 21, 1981

[54] SURFACE ACOUSTIC WAVE FILTER

[75] Inventors: Yasuaki Kinoshita, Hachioji; Mitsutaka Hikita, Kokubunji, both of Japan

[73] Assignee: Hitachi, Ltd., Tokyo, Japan

[21] Appl. No.: 94,736

[22] Filed: Nov. 15, 1979

[30] Foreign Application Priority Data

Nov. 15, 1978 [JP] Japan .......................... 53-156152[U]

[51] Int. Cl.³ .................... H03H 9/64; H03H 9/145; H01L 41/16
[52] U.S. Cl. .................................. 333/194; 333/154; 333/195
[58] Field of Search ............................ 333/150–155, 333/193–196; 331/107 A; 310/313

[56] References Cited

U.S. PATENT DOCUMENTS

| | | | |
|---|---|---|---|
| 3,886,504 | 5/1975 | Hartmann et al. | 333/195 |
| 4,130,813 | 12/1978 | Sandy et al. | 333/194 |

OTHER PUBLICATIONS

Sandy et al–"Surface Acoustic Wave Ring Filter", 1976, Ultrasonics Symposium Proceedings, IEEE Cat. No. 76 CH 1120-5 SU, pp. 391–396.

*Primary Examiner*—Marvin L. Nussbaum
*Attorney, Agent, or Firm*—Craig and Antonelli

[57] ABSTRACT

A broad-band surface acoustic wave filter of turn reflector type in which the number N of thin film finger or stripe electrode pairs in at least one transducer is selected to satisfy $N = F/k^2$ to obtain a flat selected band in the frequency response, where F is the constant determined by the material of the used piezo-electric substrate and "$k^2$" is the electro-mechanical coupling coefficient.

4 Claims, 10 Drawing Figures

SURFACE ACOUSTIC WAVE FILTER

BACKGROUND OF THE INVENTION

1. Field of the Invention

This invention relates generally to a surface acoustic wave filter and more particularly concerns a broadband band pass filter with a selected frequency response, comprising a thin film device in which surface acoustic waves are coupled from a transmitting interdigital transducer through reflectors to a receiving interdigital transducer.

2. Description of the Prior Art

In communication and electronic equipment, particularly, VHF and UHF television sets, radios, and wireless communication equipment, high frequency filters are indispensable.

As a high frequency filter, a filter is used wherein a surface acoustic wave is piezo-electrically generated and then detected. That is, a surface acoustic wave filter has been developed as a substitute for a conventional filter which is a combination of lamped constant elements such as coils, capacitors, etc. Various types of surface acoustic wave filters have been suggested so far according to the application requirements, and some of them are already used in television sets, etc.

The surface acoustic wave filter in which there are provided on a piezo-electric substrate two interdigital transducers each of which consists of thin film finger electrodes, is based on the fact that if the filter satisfies relation f=v/2L, then the filter transmits signals most efficiently. Where, L indicates the spacing distance between the abovementioned film finger electrodes, "v" is a velocity in synchronism with the spacing distance, and "f" is a frequency of signals to be transmitted. The filter of this type can be made more compact especially for use of signals from tens to several micrometers in wave length in VHF and UHF frequency band. Further, it can be formed as a planer circuit in which thin film conductors are placed on a tiny chip surface. Because of its possibility of an integrated circuit, that is, compactness and its stable operation, great expectation has been placed on the development of the surface acoustic wave filter.

Surface acoustic wave filters are grouped into two broad classes, transversal and resonant filters. The former has a disadvantage that the loss is relatively large, since 50% of the energy in a surface acoustic wave converted through a transducer is absorbed into the acoustic material. On the other hand, the latter has an advantage that the loss is relatively small, since the energy converted to a surface acoustic wave is enclosed on the substrate surface. However, the latter has also a disadvantage that it is usually difficult to obtain a desired frequency response due to the frequency characteristic of the reflector. More specifically, although it is desirable for the filter frequency response to be flat, a resonant type of surface acoustic wave filter tends to fluctuate or ripple in the frequency response.

The inventors have proposed a surface acoustic wave filter with a low loss and a wide-band frequency response, prior to the present invention, in the Y. Kinoshita et al. U.S. application Ser. No. 18,331, entitled "Surface Acoustic Filter". The surface acoustic wave filter described in the above U.S. application is of the same type as that in FIG. 1 in which a transmitting interdigital transducer 1 and a receiving interdigital transducer 2 are provided on a piezo-electric substrate 9; a group of reflecting electrodes 6 are positioned at the respective one sides of the transducers; and a directional multi-stripe coupler 7 is provided between the transducers 1 and 2 and the reflecting electrode group 6 for coupling of acoustic energy of a transmission signal to the receiving transducer.

The surface acoustic wave filter of the above-mentioned construction has been already known as a narrow band filter, for example, in the U.S. Pat. No. 3,886,504 and in an article entitled "Some Study on SAW Resonantor and Multiple-Mode Filters" by Y. Suzuki, H. Shimizu et al, in the Ultrasonic Symp. Proc., 1976, p. 297. However, in accordance with the theory known hitherto, it is impossible to get an ideal flat and broad-band frequency response. In other words, ripples will appear in the frequency response. The present inventors considered that such ripples result from the fact that multiple reflections occurs between the opposed reflecting electrode groups through the transducers. Therefore, in the surface acoustic wave filter according to the present invention, the above-mentioned multi-stripe coupler comprises a 3 dB directional coupler. It has been found that in the surface acoustic wave filter suggested in U.S. application Ser. No. 18,331 by the same inventors, ripples can be remarkably reduced, leaving small amount of ripples in the frequency response. In order to eliminate such remaining ripples completely, the filter will require the addition of matching coils as inductance elements to the input and output signal circuits. However, the addition of external coils to the surface acoustic wave filter means reduction of the effectiveness of the filter.

SUMMARY OF THE INVENTION

Accordingly, it is an object of the present invention to provide a surface acoustic wave filter with a low loss and a broad selected band frequency response in which no ripple occurs in the frequency response.

Another object of the present invention is to provide a surface acoustic wave filter in which an array of thin metal film is disposed on a piezo-electric substrate to obtain a flat selected frequency response without any ripple, and which requires no external coils.

To attain the above and further objects that may hereinafter appear, there is provided a surface acoustic wave filter in which a transmitting interdigital transducer and a receiving interdigital transducer are arranged on a piezo-electric substrate so that the two transducers are in line with each other along the entire length of a group of thin film finger electrodes, first two reflectors are disposed at one side of the transducers and second two reflectors are on the other side thereof, and acoustic energy is coupled from the transmitting transducer through the first or second reflectors to the receiving transducer. The surface acoustic wave filter is characterized in that the number N of the thin film finger electrode pairs in at least one of the transmitting transducer and receiving transducers, a constant F which is determined by the material of the available piezo-electric substrate, and the electro-mechanical coupling coefficient "$k^2$" are selected so as to meet $N=F/k^2$.

It has been found by the inventors that fluctuation or ripples in the frequency response of a conventional surface acoustic wave filter will result from the fact that where a surface acoustic wave (that is, acoustic energy) from the transmitting transducer reaches the receiving transducer where the wave is changed to an electric signal and sent to a load resistor, if the receiving transducer is not impedance matched completely to the load resistor, the reflected power excites again the surface acoustic wave through the receiving transducer by the amount corresponding to the improper matching. The excited surface acoustic wave arrives at the transmitting transducer. In the similar manner to that at the receiving transducer, the excited wave re-excites the surface acoustic wave at the transmitting transducer due to mismatching. The re-excited wave will interfere with the wave which arrived first at the receiving transducer. This way, the inventors found that if the transmitting and receiving transducers are impedance-mismatched to a 3 port transducer which terminates with a matched load, then reflected waves will interfere with one another, which results in ripples of the frequency response.

In a conventional filter of this type, the number of thin film finger electrode pairs was selected simply so as to provide good effect on the frequency characteristics of the reflectors. On the other hand, impedance matching problem was resolved by determining the length of each finger electrode of the transducers with respect to the absolute value of the impedance and by adding coils to the electric circuit connected to the transducers with respect to the phase angle thereof. This is because the increased number of thin finger electrode pairs of the transducer may cause multiple reflections of waves in the transducer, which may interfere with the above-mentioned excited waves at the transmitting or receiving transducer.

According to the surface acoustic wave filter of the present invention, the impedance matching is accomplished in both the absolute value and phase angle of the impedance, whereby ripples in the frequency response of the filter can be eliminated without using any coils.

The above and other objects and advantages of the present invention will become clear from the following description with reference to the accompanying drawings.

DESCRIPTION OF THE PREFERRED EMBODIMENT

Figure 1:
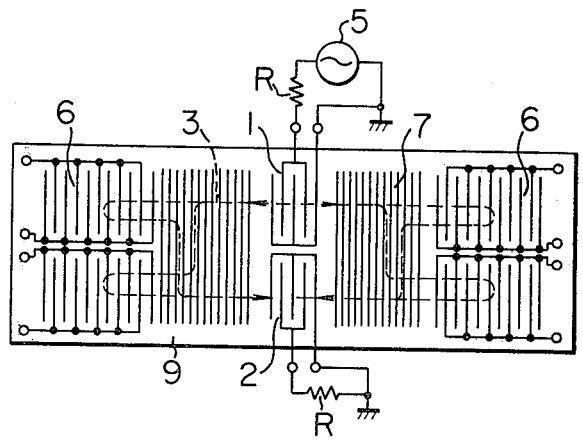
FIGS. 1 to 3 are plan views of different embodiments of a surface acoustic wave filter according to the present invention.

Referring now to the drawings, there is shown in FIG. 1 a surface acoustic wave filter of a first embodiment according to the present invention in which transmitting and receiving interdigital transducers 1 and 2 are arranged vertically to form a line in the middle of the surface of a substrate 9. The substrate 9 is made of piezo-electric material such as lithiumniobate, and the transducers 1 and 2 each consists of thin film finger electrodes. Further, each transducer has one reflector 6 at its one side, that is, a total of four reflectors are provided on the substrate 9. A 3 dB directional coupler 7 is provided between the transducers and the two reflectors in each side of the substrate, that is, a total of two directional couplers are provided on the substrate. The transmitting transducer 1 is connected to an input electric circuit which consists of a signal generator 5 and an input resistor R, and the receiving transducer 2 is connected to an output electric circuit which consists of an output resistor R. It will be understood that although the transducers, directional couplers and reflectors in FIG. 1 are indicated only with lines for the brevity of the explanation, they actually consist of many thin film metal stripes, for example, made of gold or silver. Furthermore, the number of the above-mentioned stripes in FIG. 1 is less than the actual one for brief explanation. As has been described earlier, at least one of the transmitting and receiving transducers must be arranged so that the number N of thin film finger electrode pairs forming the transducer meets $N = F/k^2$ in accordance with the principle of the present invention.

Where, the number of electrode pairs means that of stripes or fingers connected to one electrode, "$k^2$" is the electro-mechanical coupling coefficient, and F is the constant determined by the material of the used piezo-electric substrate. It will be apparent from the experimental results (which will be described later) that if the piezo-electric substrate is of LiNbO$_3$ 64° rotated Y-cut X axis propagation, then the number of electrode pairs is selected to be 14.

In this embodiment, since a 3 dB directional coupler is employed as the coupler 7, the number M$_c$ of conductive stripes is determined so as to satisfy $$M_c = \pi/Fk^2 \cdot \theta/2 / \sin(\theta/2)$$

where, $\theta = 2\pi f \cdot \alpha d_o/v_s$, "f" is the frequency of the surface acoustic wave, "$d_o$" is a spacing between the stripes, $\alpha$ is the ratio of the actual stripe width and the effective one, and $v_s$ is the sound velocity of the surface acoustic wave.

The reflector 6 in the embodiment is constructed so that the reflector consists of thin film or stripe finger electrodes which are alternately arranged with one another at proper spacings, and so that the voltage applied to the electrodes can change the reflection characteristic of the reflector.

Figure 2:
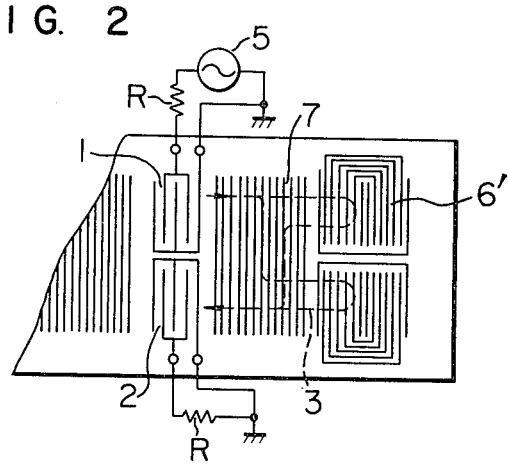

Of course, the reflector may be constructed not as electrodes but as thin conductive film stripes which are arranged in parallel with one another. In addition, the reflector may be a combination of U shaped stripes 6', as shown in FIG. 2 (because the parts other than the reflectors are exactly the same as those in FIG. 1, the explanation thereabout will be omitted).

With the arrangement as has been described, the acoustic energy from the transmitting transducer is divided at both sides thereof into two, each of which is coupled through the above-mentioned 3 dB directional coupler 7 and the reflectors 6 to the receiving transducer 2, along paths 3 shown with dotted lines.

That is, the 3 dB directional coupler 7 and the two reflectors 6 will function to reflect the surface acoustic wave supplied from the transmitting transducer into the receiving transducer 2 as if a car were turned around. More specifically, the acoustic energy of the surface acoustic wave directed from the transmitting transducer 1 into the 3 dB directional coupler 7 is divided into two, which, in turn, are directed into the associated reflectors 6, respectively. The surface acoustic waves reflected at the associated reflectors 6 are each directed back to the 3 dB directional coupler 7. That is, the original acoustic energy is divided into 4 energy components. Two of the four energy components are directed back to the transmitting transducer 1, but cancelled to each other due to their phase relationship. The remainder two are added due to their phase relationship and directed to the receiving transducer 2. As a result, the 3 dB directional coupler and the two reflectors operate as a turn reflector.

Therefore, the surface acoustic wave filter according to the present invention can be applied to a filter which uses two sets of reflectors without the above-mentioned 3 dB directional coupler.

Figure 3:
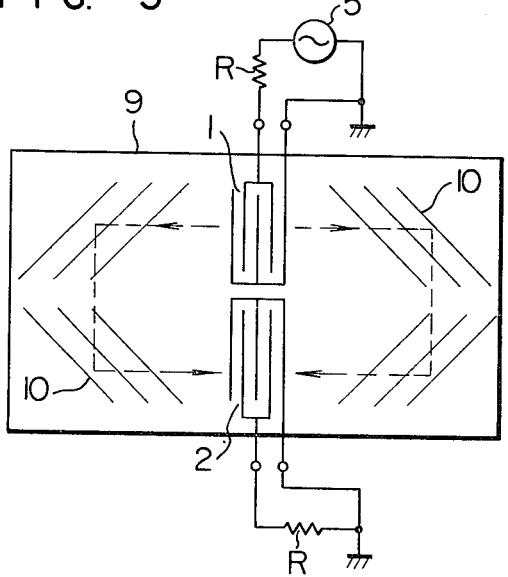

There is shown in FIG. 3 a surface acoustic wave filter of a third embodiment in accordance with the present invention in which each reflector comprises a plurality of grooves 10 cut at a 45° angle with respect to the entire length of the stripes of the transducers at both sides of the transducers on a piezo-electric substrate. In the third embodiment, the acoustic energy moves from the transmitting transducer 1 to the receiving transducer 2, along the path shown with a dotted line, that is, the filter is of turn type. Similarly, the surface acoustic wave filter in this embodiment having a broad band, low loss, less ripple can be realized by selecting the number of thin finger or stripe electrodes pairs in at least one of the transmitting and receiving transducers to meet the relationship given above.

Figure 4:
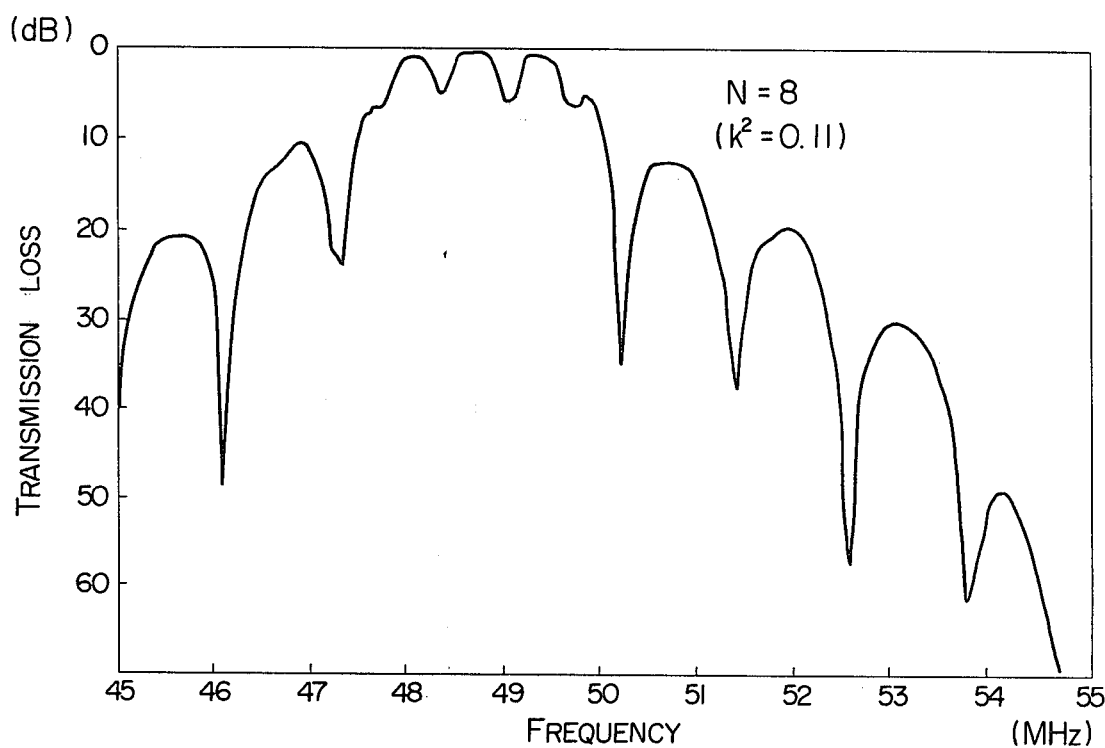
FIGS. 4 to 9 are graphs representative of frequency responses of the surface acoustic wave filters in FIG. 1, which show the relation between the image transmission loss and the frequency with respect to the different number N of thin film finger electrode pairs of the transducer and the different electro-mechanical coupling coefficient "$k^2$".
Figure 5:
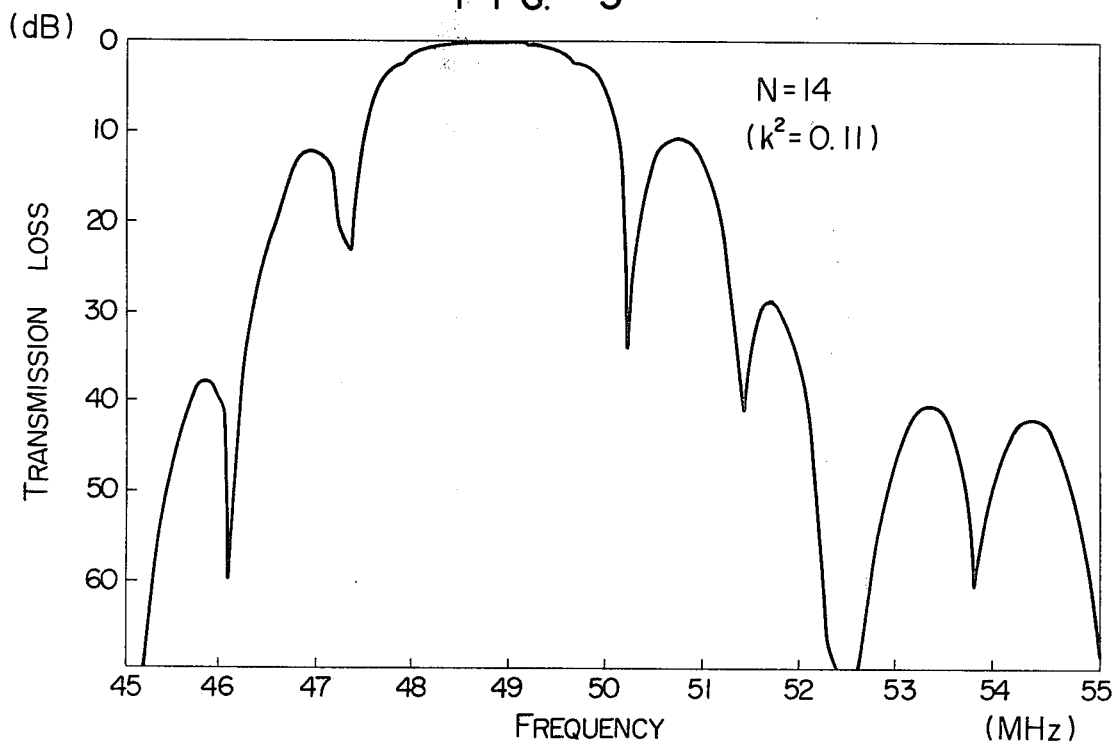
Figure 6:
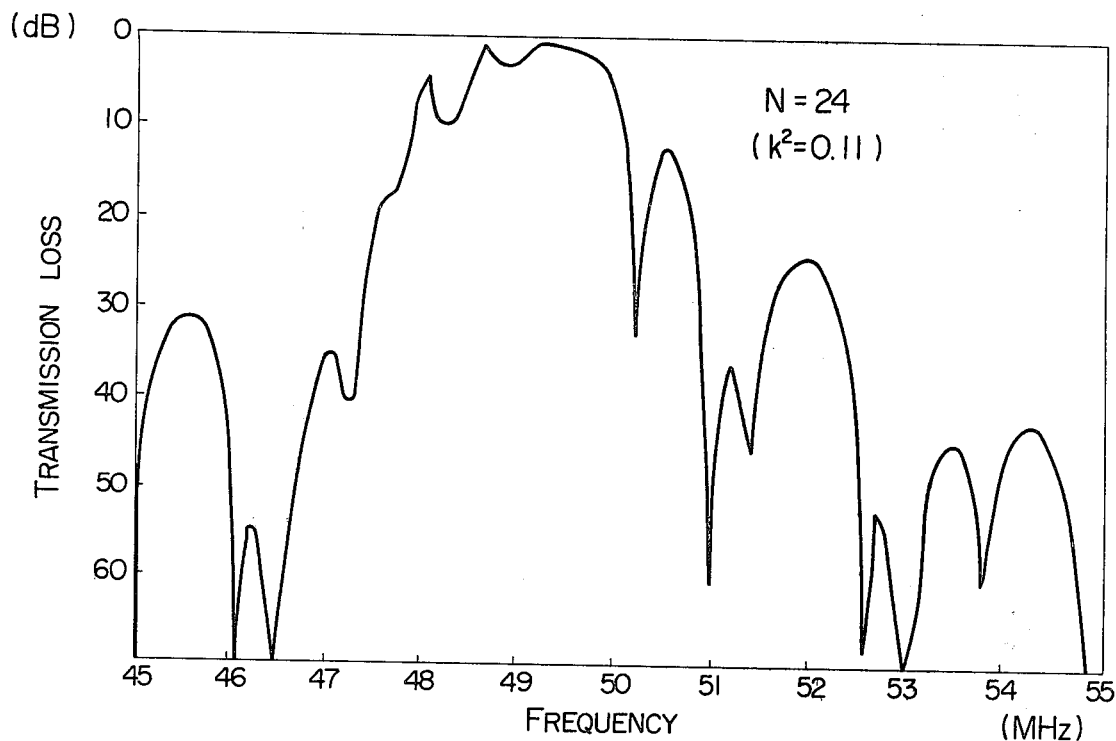

FIGS. 4 to 6 are graphs representative of frequency responses as the experimental results which show the relation between the image transmission loss and the frequency by the use of the surface acoustic wave filter shown in FIG. 1, when the electromechanical coupling coefficient "$k^2$" is 0.11 commonly and the number N of thin film finger electrode pairs in the transmitting and-/or receiving transducer is 8, 14 and 24, respectively. In this case, the substrate material used is of LiNbO$_3$ rotated Y-cut X axis propagation, and the constant F determined by the material is 1.5. As will be seen from FIGS. 4 to 6 that when the number N of thin film finger electrode pairs is 14, that is, $N \simeq F/k^2 = 1.5/0.11$, the filter has the least ripple in a selected frequency band between 47 and 50 MHz.

Figure 7:
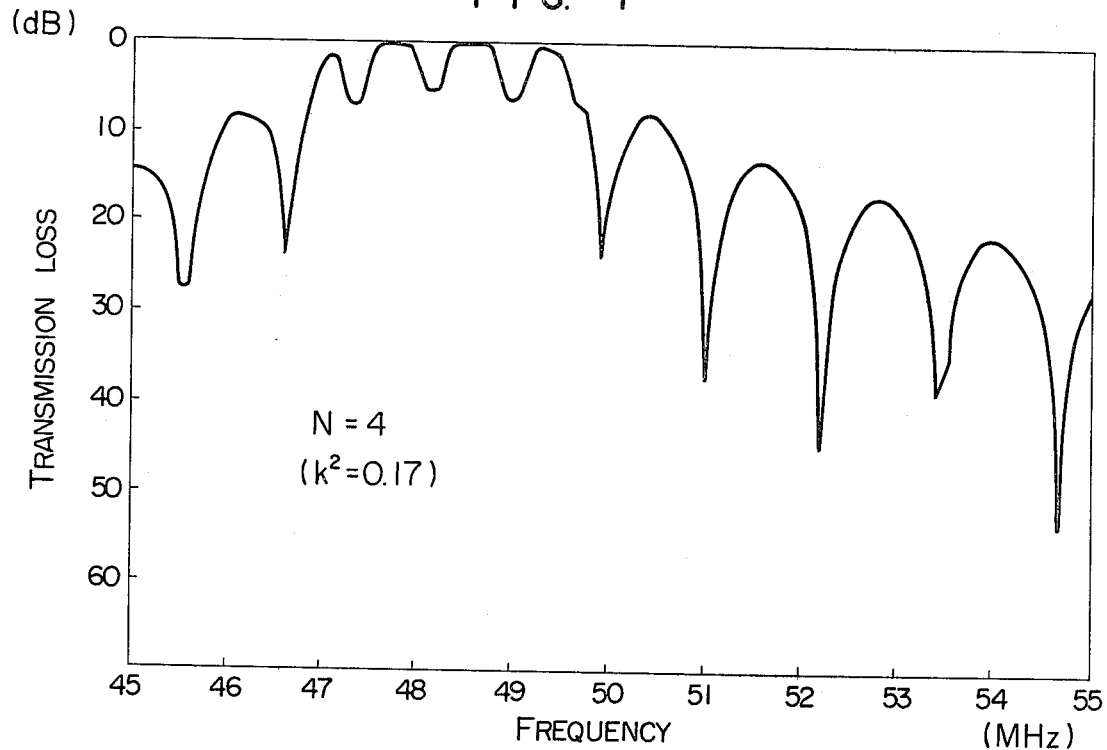
Figure 8:
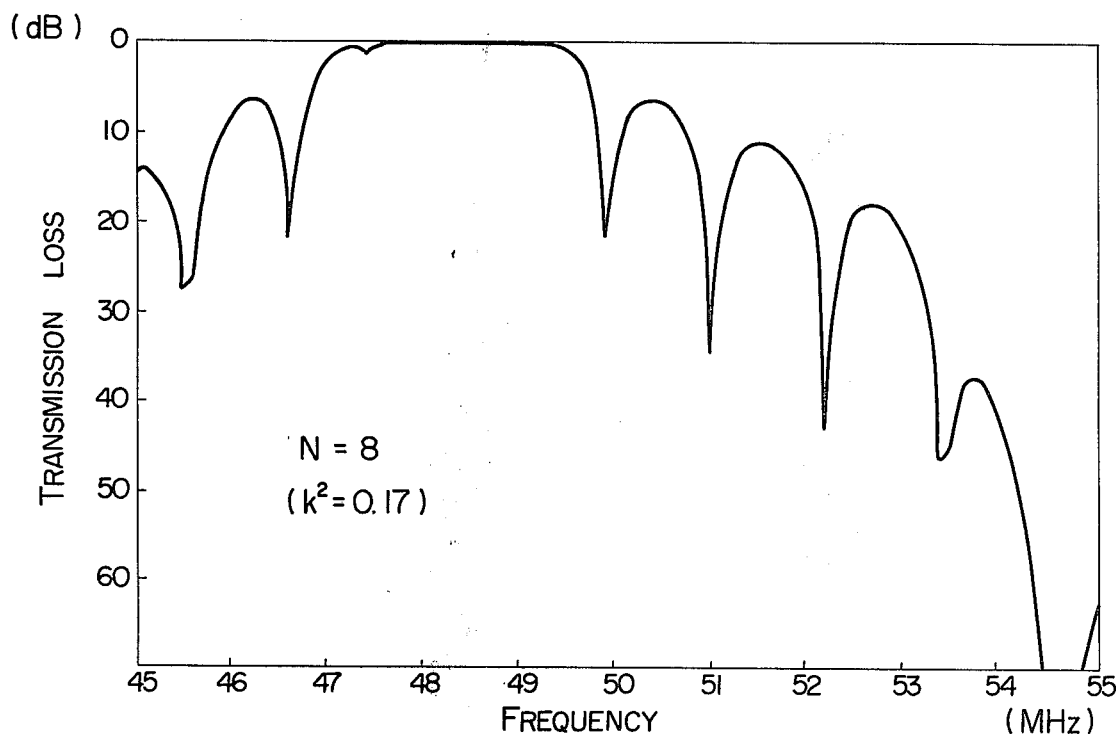
Figure 9:
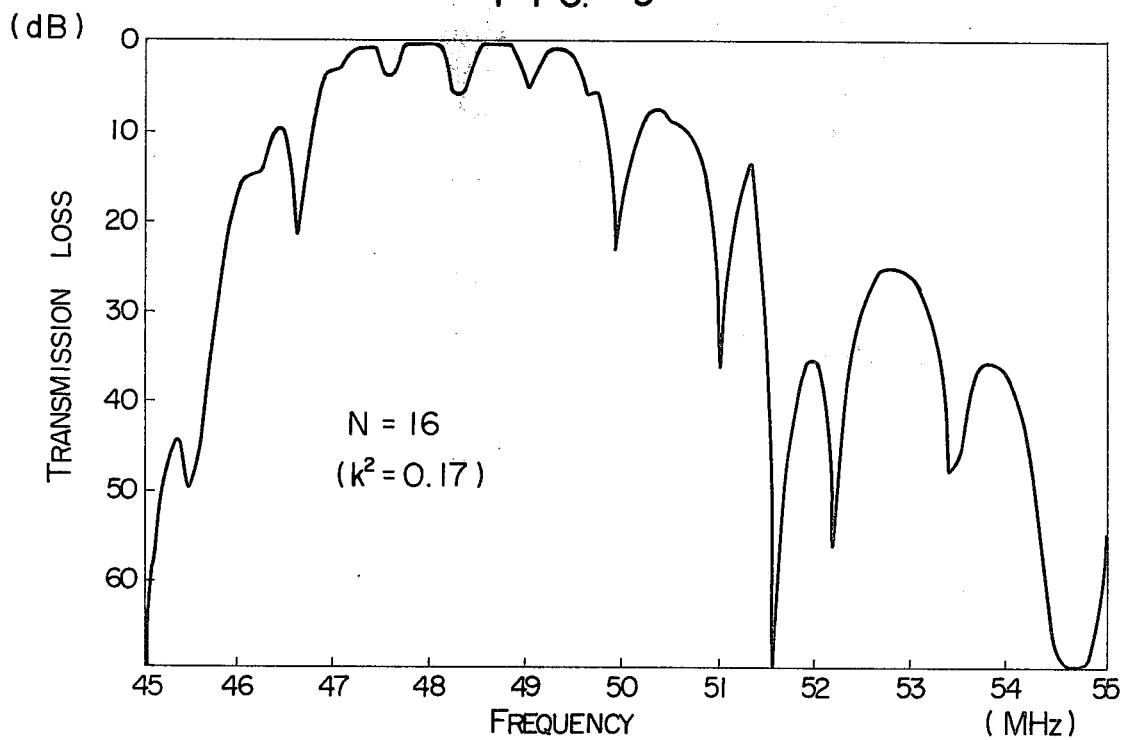

There are shown in FIGS. 7 to 9 frequency responses as experimental results which show the relation between the image transmission loss and the frequency by the use of the surface acoustic wave filter shown in FIG. 1, when the electro-mechanical coupling coefficient "$k^2$" is commonly 0.17 and the number N of thin film finger electrode pairs is 4, 8 and 16, respectively. In this case, it will be observed from FIGS. 7 to 9 that when the number N of thin film finger electrode pairs is 8, the filter has the least ripple in a selected frequency band between 47 and 50 MHz.

Figure 10:
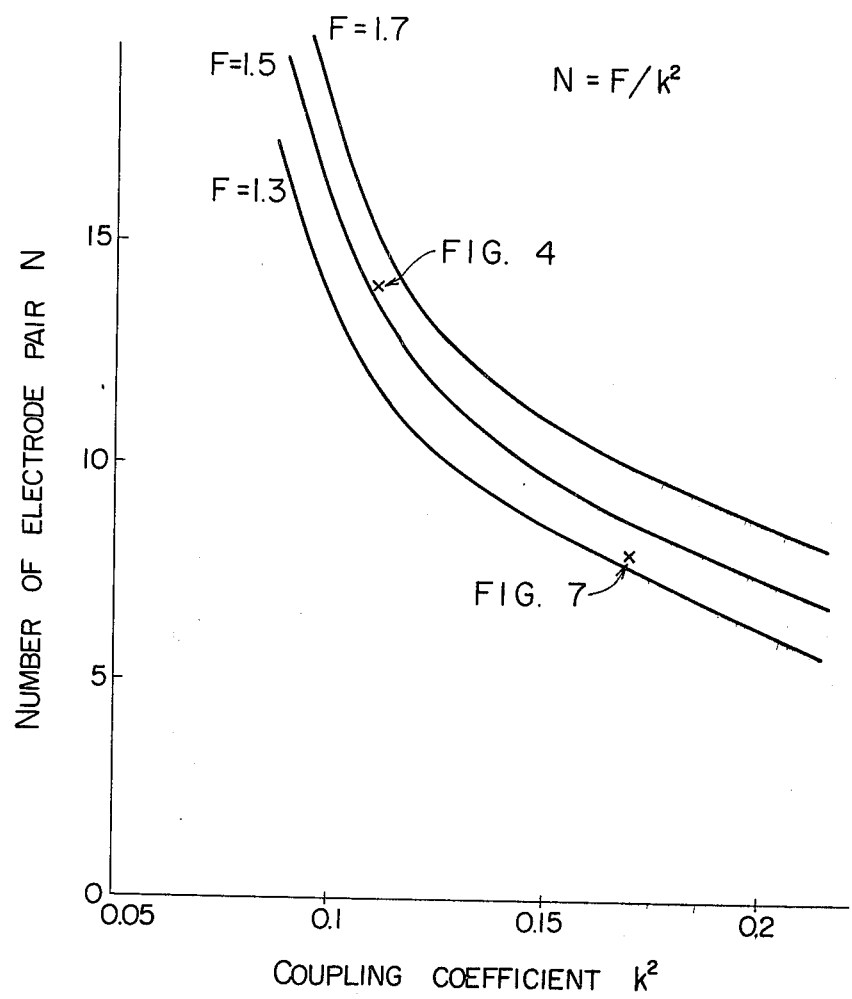
FIG. 10 is a graph which shows the relation between the number N of thin finger electrode pairs and the electro-mechanical coupling coefficient "$k^2$" with respect to different constant F, based on FIGS. 4 to 9.

FIG. 10 shows the relation between the number N of thin film finger electrode pairs and the coupling coefficient "$k^2$" with respect to different constant F, corresponding to FIGS. 5 and 8 (which are in the optimum condition). As seen from FIG. 10, the optimum number N of thin film finger electrode pairs is inversely proportional to the coupling coefficient "$k^2$". This is because the maximum dynamic inductive suceptance is directly proportional to the coupling coefficient "$k^2$".

With the arrangement as has been described, the present invention has such advantages that the surface acoustic wave filter loss is low because the filter is of turn reflector type, and the ripples in a selected band of the frequency response can be eliminated without adding any external circuit by maintaining a relation between the number of thin film finger electrode pairs in the transducer and the constant determined by the piezo-electric substrate material, thereby allowing a broad band filter.

While the present invention has been described with reference to the preferred embodiments shown in the drawings, it should be understood that the invention is not limited to those embodiments but includes all other possible modifications, alternation and equivalent arrangements within the scope of appended claims.

We claim:

1. A turn reflector type of surface acoustic wave filter comprising a transmitting transducer having a group of thin film finger or stripe electrodes on the surface of a piezo-electric substrate for converting a first electric signal to a surface acoustic wave, a receiving transducer having a group of thin film finger or stripe electrodes on the substrate for converting said surface acoustic wave to a second electric signal, and reflectors provided at both sides of said transmitting and receiving transducers; wherein the number N of the thin film finger electrode pairs in at least one of said transmitting and receiving transducers is selected so as to satisfy $N \simeq F/k^2$, where F is the constant determined by the material of said substrate and "$k^2$" is the electro-mechanical coupling coefficient.

2. The turn reflector type of surface acoustic wave filter as defined in claim 1 wherein said piezo-electric substrate is of lithiumniobate Y-cut propagation and said constant F determined by the substrate material is selected to be 1.5.

3. The turn reflector type of surface acoustic wave filter as defined in claim 1 wherein 3 dB directional couplers are provided between said transmitting and receiving transducers and said reflectors.

4. The turn reflector type of surface acoustic wave filter as defined in claim 1 wherein said each reflector consists of a plurality of grooves cut at a 45° angle with respect to the length of the stripe electrodes in said transmitting and receiving transducers.

* * * * *